United States Patent [19]

Osada

[11] Patent Number: 4,936,734
[45] Date of Patent: Jun. 26, 1990

[54] CHUCK FOR TRANSPORTING A WAFER CARRIER

[75] Inventor: Atsushi Osada, Kofu, Japan

[73] Assignee: Tel Yamanashi Limited, Nirasaki, Japan

[21] Appl. No.: 257,443

[22] Filed: Oct. 12, 1988

[30] Foreign Application Priority Data

Oct. 12, 1987 [JP] Japan .......................... 62-156291[U]

[51] Int. Cl.⁵ .......................................... B65G 69/00
[52] U.S. Cl. ................... 414/621; 414/787; 414/736; 294/87.1; 294/902; 294/88; 294/87.26; 901/37; 901/31
[58] Field of Search ...... 294/87.1, 87.26, 88, 294/902; 414/751, 753, 744.1, 744.8, 621, 622, 731, 787; 901/31, 36

[56] References Cited

U.S. PATENT DOCUMENTS

| | | | |
|---|---|---|---|
| 1,909,813 | 5/1933 | Crosbie | 414/736 |
| 3,184,088 | 5/1965 | Berge | 414/621 |
| 3,992,049 | 11/1976 | Milholen et al. | 294/87.1 |
| 4,184,799 | 1/1980 | Arndt | 414/54 |
| 4,228,902 | 10/1980 | Schulte | 294/87.1 X |

FOREIGN PATENT DOCUMENTS

| | | | |
|---|---|---|---|
| 1214368 | 6/1962 | Fed. Rep. of Germany ... | 294/87.26 |
| 248694 | 8/1987 | German Democratic Rep. ... | 901/37 |
| 61-10468 | 4/1986 | Japan . | |
| 61-117254 | 7/1986 | Japan . | |
| 61-150918 | 7/1986 | Japan . | |
| 61-239307 | 10/1986 | Japan . | |
| 79923 | 4/1987 | Japan | 901/31 |
| 62-118535 | 5/1987 | Japan . | |
| 62-124750 | 6/1987 | Japan . | |
| 1279946 | 12/1986 | U.S.S.R. | 414/621 |
| 1313708 | 5/1987 | U.S.S.R. | 414/736 |

Primary Examiner—Frank E. Werner
Attorney, Agent, or Firm—Oblon, Spivak, McClelland, Maier & Neustadt

[57] ABSTRACT

A chuck for transporting wafer carriers is designed to hold the wafer carriers in a cantilever manner and with support members supporting one sides of the wafer carriers. This enables the whole chuck to be extremely compact. This also enables the wafer carriers to be made freer fron any limit while they are being transported and prevents them from being damaged because they can be steadily transported.

6 Claims, 4 Drawing Sheets

CHUCK FOR TRANSPORTING A WAFER CARRIER

BACKGROUND OF THE INVENTION

1. Field of the Invention

The present invention relates to a chuck for transporting a wafer carrier.

2. Description of the Related Art

A wafer carrier is used to house a plurality of semiconductor wafers (which will be hereinafter referred to as wafers). The wafers held by a chuck are carried to a predetermined process. The conventional chuck for transporting a wafer carrier is of the type which supports the front and back faces of the wafer carrier. Namely, the chuck for transporting the wafer carrier has a pair of rails arranged between a place where a process is carried out and another place where another process is conducted. An arm having a support contacted with the front face of the wafer carrier and another arm separated from the first arm by a certain distance and having a support contacted with the back face of the wafer carrier are arranged between the rails. The arms are moved along the rail with the wafer carried held between them.

However, this wafer carrier transporting chuck becomes large in size. In addition, the wafer carrier cannot be free from some limits because it must be carried along the rails which are located at both sides of it.

SUMMARY OF THE INVENTION

The object of the present invention is to provide for a chuck for transporting a wafer carrier, which can be small in size and simple in construction and make the wafer carrier free from any limit while it is being carried.

According to the present invention, there is provided a chuck for transporting a wafer carrier comprising at least a pair of chuck pieces whose interval is variable and which are contacted with both end faces of one side of an object to be chucked between them, a pair of sliders connected to their respective chuck pieces, driver means for reciprocating the paired sliders along guide rails to change the interval between the chuck pieces, and a support member located between the paired chuck pieces and contacted with one side of the object.

DETAILED DESCRIPTION OF THE PREFERRED EMBODIMENTS

Figure 1:
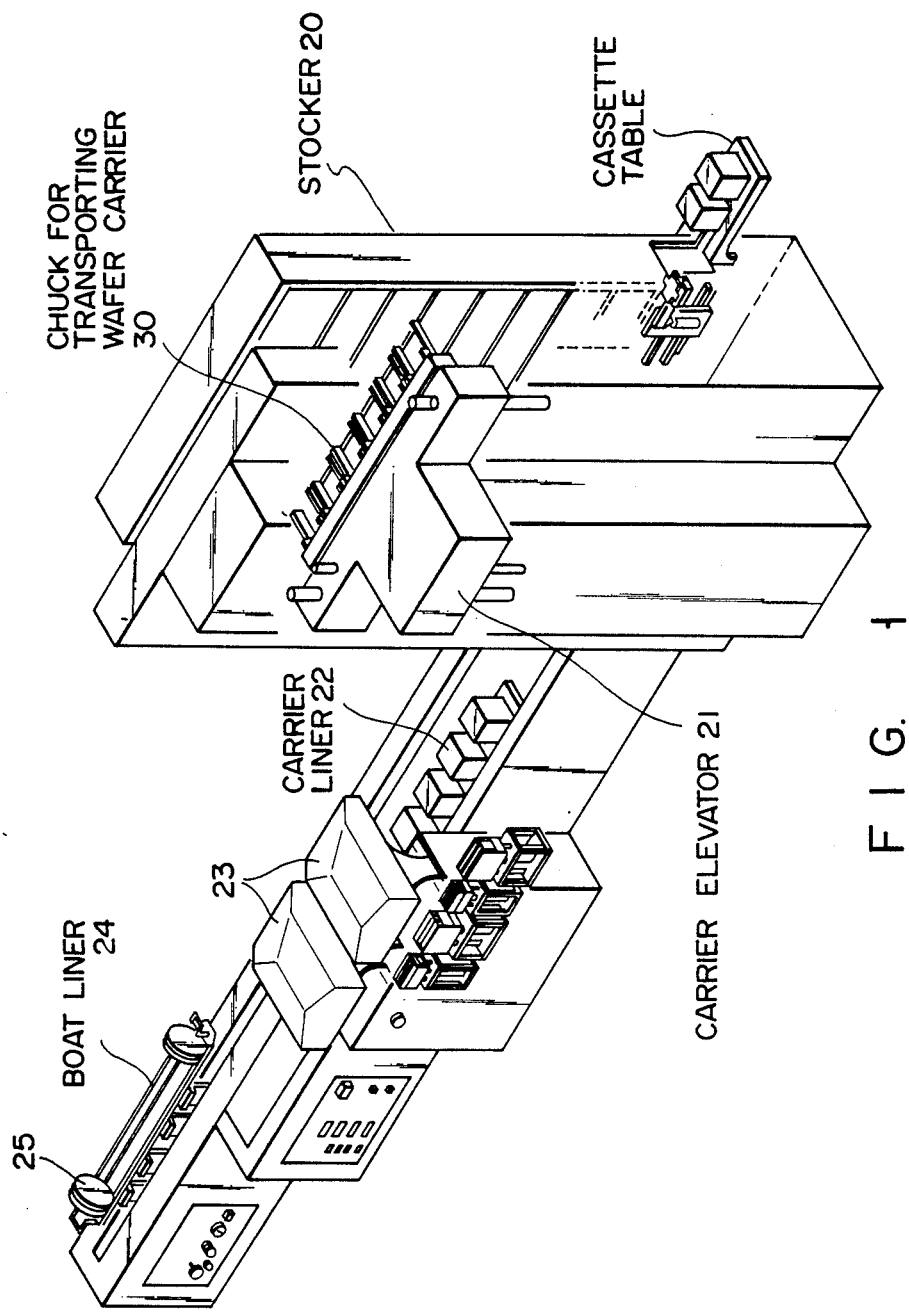
FIG. 1 is a perspective view showing an example of the wafer carrier transporting chuck of the present invention attached to an carrier elevator for wafer carrier stock units.

FIG. 1 is a perspective view showing a case where chuck 30 for transporting wafer carriers according to the present invention is attached to carrier elevator 21 for wafer carrier stock units 20, which houses a plurality of wafer carriers (not shown) to be carried to carrier liner 22 by wafer carrier transporting chuck 30. Wafers in the wafer carrier are transferred from carrier liner 22 to boat liner 24 by transfer means 23. Boat liner 24 on which a plurality of wafers 25 are mounted is carried into and out of a reaction furnace (not shown) or the like.

Figure 2:
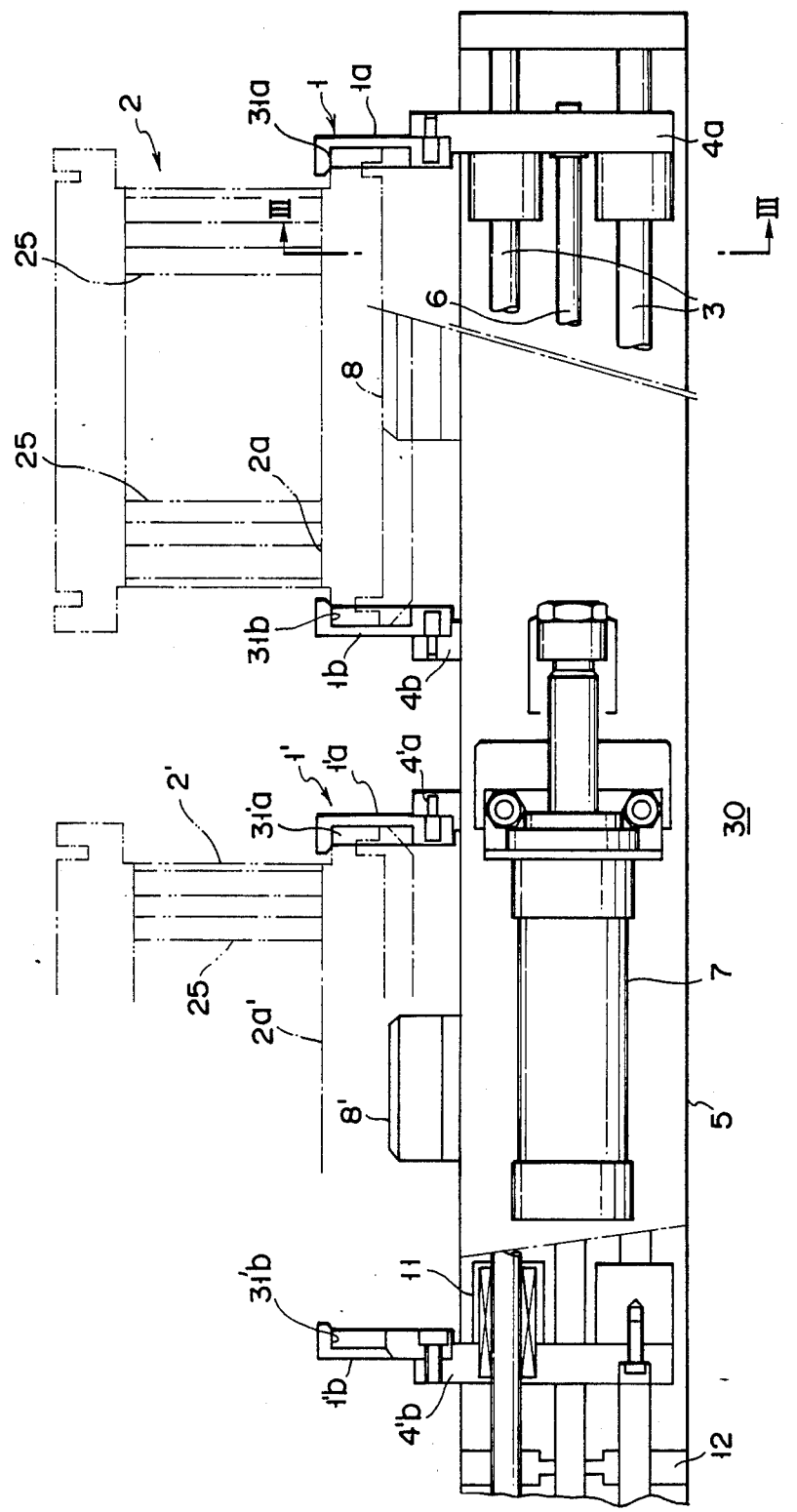
FIG. 2 is a plane view showing an arrangement of the wafer carrier transporting chuck.
Figure 3:
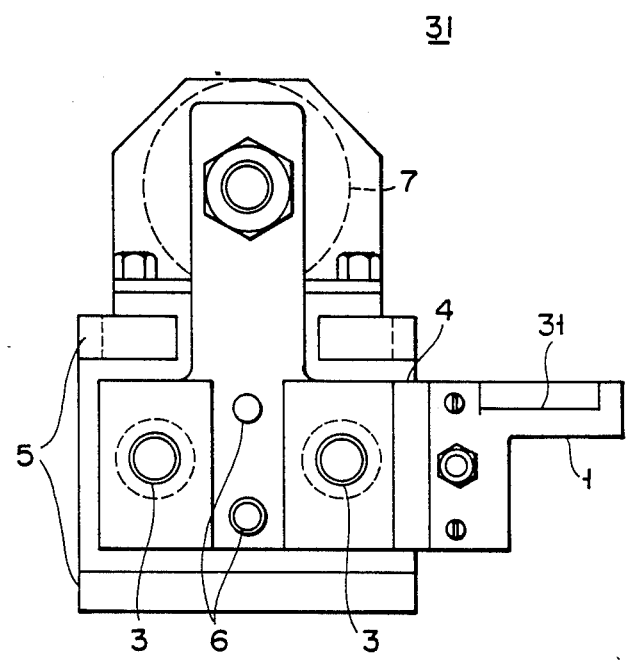
FIG. 3 is a sectional view taken along a line III—III in FIG. 2.

Wafer carrier transporting chuck 30 has an arrangement shown in FIGS. 2 and 3. Numeral 1 denotes a pair of wafer holding chucks between which wafer carrier 2 is held. Two of wafer holding chucks 1 and 1' are shown in FIG. 2. Right chuck piece 1a which is a part of one wafer holding chuck 1 is attached to one end of right slider 4a. Left chuck piece 1b is attached to one end of left slider 4b. The other ends of right and left sliders 4a and 4b are freely movably housed in outer frame 5. Guide rails 3 for guiding right and left sliders 4a and 4b along the longitudinal direction of outer frame 5 are passed through the other ends of right and left sliders 4a and 4b via ball bearings 11.

The other wafer holding chuck 1' is arranged adjacent to one wafer holding chuck 1, having a certain interval relative to the latter. Wafer holding chuck 1' has the same arrangement as that of wafer holding chuck 1. Namely, right chuck piece 1'a is connected to right slider 4'a, while left chuck piece 1'b to left slider 4'b. Right and left sliders 4'a and 4'b are freely movably attached to guide rails 3 through ball bearings 11. Guide rails 3 are held by reinforcing plates 12 which are arranged at a certain interval in outer frame 5. Support members 8 and 8' are arranged at the front of outer frame 5 between right and left chuck pieces 1a and 1b and between right and left chuck pieces 1'a and 1'b, respectively. Support members 8 and 8' are contacted with one sides of wafer carriers 2 and 2' which are held by wafer holding chucks 1 and 1'. Right and left chuck pieces 1a, 1'a and 1b, 1'b are provided with grooves 31a, 31'a and 31b, 31'b on inner sides thereof and both ends of one sides 2a and 2'a of wafer carriers 2 and 2' are fitted into these grooves.

The two right sliders 4a and 4'a are connected to each other through connecting bar 6 while the two left sliders 4b and 4'b are also connected to each other through connecting bar 6.

The two right sliders 4a and 4'a are connected to air cylinder 7 mounted on outer frame 5 while the two left sliders 4b and 4'b are connected to another air cylinder (not shown) also mounted on outer frame 5. In other words, right sliders 4a and 4'a are reciprocated along guide rails 3 by air cylinder 7 while left sliders 4b and 4'b are reciprocated along rails 3 by the other air cylinder. As a result, wafer holding chucks 1 and 1' can freely adjust their intervals between right and left chuck pieces 1a and 1b and between right and left chuck pieces 1'a and 1'b by the air cylinders. Each of the support members 8 and 8' is preferably made of polytetrafluoroethylene (teflon) or the like which has sufficient strength and durability.

The air cylinders are set to keep open right and left chuck pieces 1a and 1b of wafer holding chuck 1 and right and left chuck pieces 1'a and 1'b of wafer holding chuck 1', respectively. When wafer carriers 2 and 2' are to be transported, carrier elevator 21 is driven. Wafer carrier transporting chuck 30 is thus moved to a certain position of stock unit 20. When wafer carrier transporting chuck 30 is to be positioned like this, wafer carriers 2 and 2' are positioned between right and left chuck pieces 1a and 1b and between right and left chuck pieces 1'a and 1'b.

Figure 4:
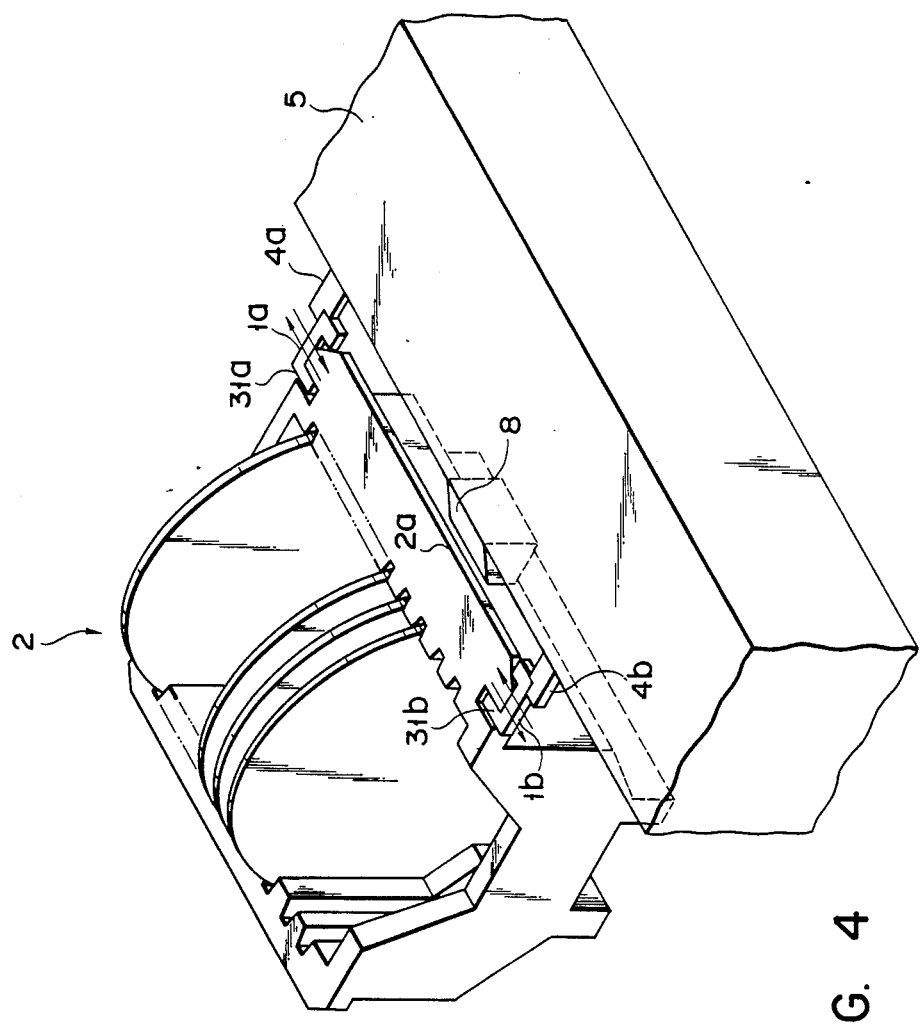
FIG. 4 is an illustrating view showing a function of the wafer carrier transporting chuck in FIG. 2.

The air cylinders are then driven and right and left chuck pieces 1'a and 1'b as well as right and left chuck pieces 1a and 1b are thus moved along connecting bar 6 to shorten the intervals between them (shown in FIG. 4). In FIG. 4, only one wafer holding chuck 1 is shown. As a result, wafer carriers 2 and 2' are held by wafer holding chucks 1 and 1'. Both ends of one sides 2a and 2'a of wafer carriers 2 and 2' are fitted this time into grooves 31a, 31b and 31'a, 31'b. Further, support members 8 and 8' are contacted with one sides 2a and 2'a of wafer carriers 2 and 2'. Carrier elevator 21 is moved up and down or in the horizontal direction, keeping wafer carriers 2 and 2' under this state. Carrier elevator 21 carries wafer carrier transporting chuck 30 to a certain position where wafer carrier transporting chuck 30 faces carrier liners 22. The air cylinders are then stopped to release wafer carriers 2 and 2' from wafer holding chucks 1 and 1'. Wafer carriers 2 and 2' are thus transferred to their respective wafer liners 22.

As described above, wafer holding chucks 1 and 1' hold one sides 2a and 2'a of wafer carriers 2 and 2' as shown in FIG. 4. In other words, wafer carriers 2 and 2' are held by wafer holding chucks 1 and 1' in a cantilever manner. This makes wafer carriers 2 and 2' freer from any limit while they are being transported. In addition, they are held by wafer holding chucks 1 and 1' with support members 8 and 8' contacted with their one sides. This enables them to be steadily transported. This also prevents them from being damaged while they are being transported. Further, wafer carrier holding chucks 1 and 1' have such arrangements that they hold wafer carriers 2 and 2' in the cantilever manner and with support members 8 and 8, contacted with wafer carriers 2 and 2'. This makes them small in size and simple in construction.

What is claimed is:

1. A chuck for transporting wafer carriers comprising at least a pair of chuck pieces respectively connected to a pair of sliders housed in a frame, said pair of chuck pieces being contacted with both end faces of one side of a carrier which is to be chucked between the paired chuck pieces, each of said chuck pieces having an inner face defining a groove which cooperates with a projection on each of said end faces of said one side of the carrier; driver means for reciprocating the paired sliders along guide rails in the frame to change the interval between the chuck pieces; and a support member located on one side of the frame between the paired chuck pieces and being positioned for contact with said one side of the carrier; wherein said carrier defines a box-like compartment, and said support member and said chuck pieces do not extend, in a direction transverse to the direction of movement of the slider, beyond a midpoint of the carrier.

2. A chuck for transporting wafer carriers according to claim 1, wherein there are a plural number of said paired chuck pieces and the paired chuck pieces are connected to the sliders in the longitudinal direction of the sliders with a predetermined interval kept between the paired chuck pieces.

3. The chuck for transporting wafer carriers according to claim 2, wherein said driver means drives one of the paired chuck pieces while another driver means drives the other of the paired chuck pieces.

4. The chuck for transporting wafer carriers according to claim 1, wherein said driver means are cylinders.

5. The chuck for transporting wafer carriers according to claim 1, wherein said support member is made of fluorocarbon resin.

6. The chuck for transporting wafer carriers according to claim 1, wherein a plurality of semi-conductor wafers are housed in the wafer carrier.

* * * * *